(12) United States Patent
Rolls et al.

(10) Patent No.: US 6,268,664 B1
(45) Date of Patent: Jul. 31, 2001

(54) FAN CONTROL MODULE FOR A SYSTEM UNIT

(75) Inventors: Jeremy B. Rolls, Wimbledon (GB); Michael J. Bushue, Belmont, CA (US); Rhod J. Jones, Crowthorne; Stepan Tatulian, Greenford, both of (GB)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/415,426

(22) Filed: Oct. 8, 1999

(51) Int. Cl.$^7$ .................................................. H05K 7/20
(52) U.S. Cl. ............................ 307/32; 307/117; 361/695
(58) Field of Search ................................ 361/690–697; 307/32, 38, 117

(56) References Cited

U.S. PATENT DOCUMENTS

| | | | |
|---|---|---|---|
| 4,644,252 | * 2/1987 | Wilkinson | 323/273 |
| 5,121,291 | * 6/1992 | Cope et al. | 361/384 |
| 5,294,050 | * 3/1994 | Hoffman et al. | 237/2 A |
| 5,436,827 | * 7/1995 | Gunn et al. | 364/187 |
| 5,484,012 | * 1/1996 | Hiratsuka | 165/40 |
| 5,631,852 | * 5/1997 | Chen | 364/557 |
| 5,727,928 | * 3/1998 | Brown | 417/44.11 |
| 5,777,897 | * 7/1998 | Giorgio | 364/557 |
| 5,793,608 | * 8/1998 | Winick et al. | 361/695 |
| 5,834,856 | * 11/1998 | Tavallaei et al. | 307/64 |
| 5,898,296 | * 4/1999 | Maddox et al. | 323/282 |
| 5,926,367 | * 7/1999 | Gutierrez et al. | 361/695 |
| 5,926,386 | * 7/1999 | Ott et al. | 363/175 |
| 6,101,459 | * 8/2000 | Tavallaei et al. | 702/132 |

* cited by examiner

Primary Examiner—Fritz Fleming
(74) Attorney, Agent, or Firm—Conley, Rose & Tayon, PC; B. Noël Kivlin

(57) ABSTRACT

A fan control module is provided for a system unit. The fan control module includes power outputs for supplying power to a plurality of fan. It also includes a temperature sensor for giving a temperature signal. It further includes a control unit connected to receive the temperature signal and including preprogrammed control information for determining power signals to be supplied to each of the fan units for controlling the speed thereof. The fan control module can control the fan units in a coordinated manner enabling reliable and effective cooling of the system unit under widely varying parameters. It can mean that existing system components can be employed in harsher temperature environments that they were originally designed for, without needed a complete redesign thereof. The fan control module can be provided with electrical noise isolation circuitry to isolate other components from electrical noise generated by the fan units. The system unit can, for example, be a computer system unit for rack mounting in a telecommunications application.

25 Claims, 17 Drawing Sheets

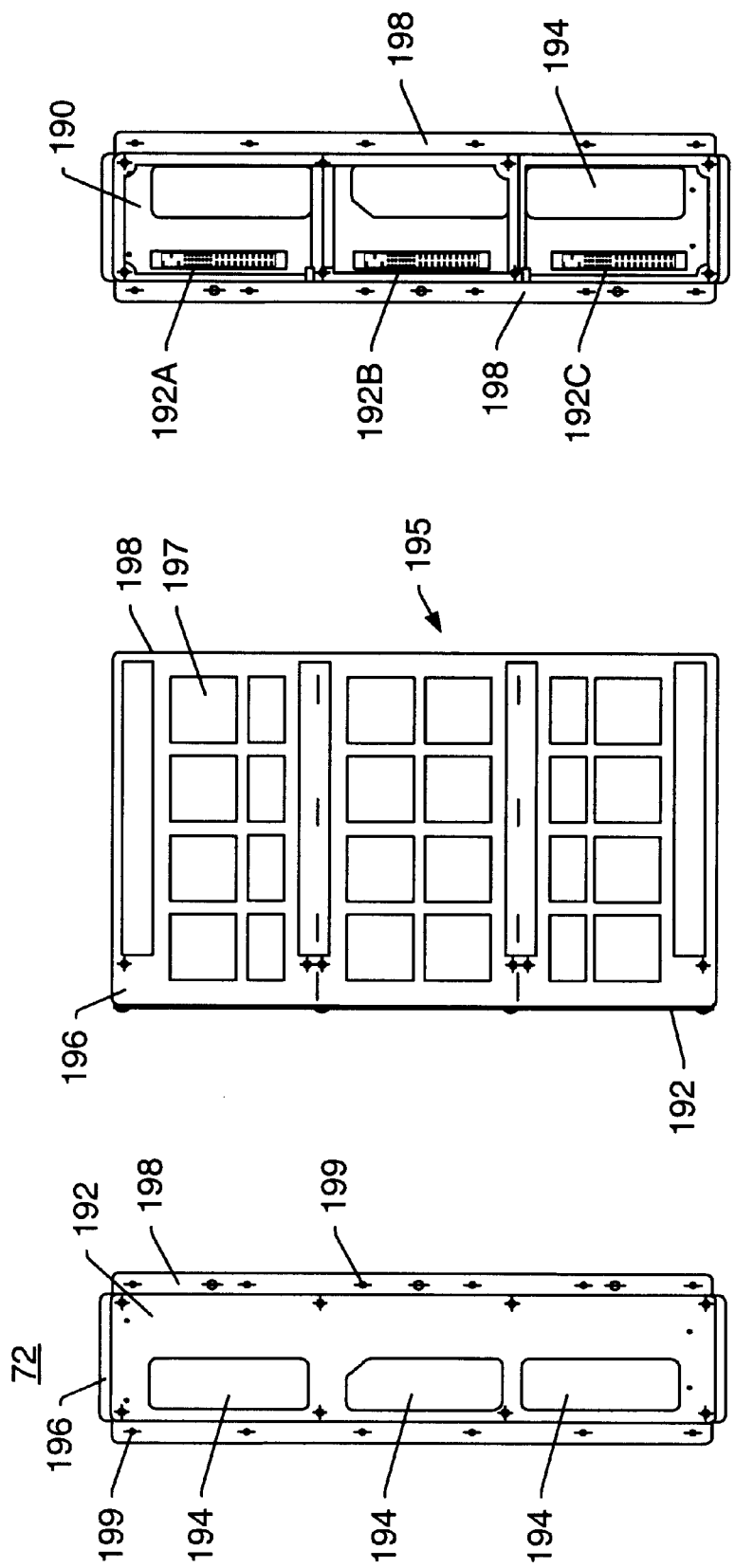

ALL CONNECTORS ARE VIEWED FROM MATING FACE

FAN CONTROL MODULE FOR A SYSTEM UNIT

BACKGROUND OF THE INVENTION

The invention relates to cooling system units. In particular, the invention relates to providing controlled cooling for a computer system for use in environments and applications that place high demands on system reliability, for example in the telecommunications industry.

Deregulation and privatization is causing unprecedented competition in the worldwide telecommunications market. This climate of fierce competition has meant that service providers must introduce new, more sophisticated and user-friendly services at an accelerated pace to retain or attract subscribers, while not compromising traditional telecommunications company (telco) service quality.

These pressures of competition have also placed high demands on Network Equipment Providers (NEPs). Traditionally, NEPs have designed, built and supported proprietary computing equipment, as the strict telco requirements could not be met by the commercial computing sector. Those requirements include the so-called Telcordia Technologies Network Equipment Buildings Systems (NEBS) tests. However, due to the lead times required to design and test such proprietary equipment, and the cost of supporting such equipment, there is a need to find another route, at least for the supply of the more cost and performance sensitive sectors within the telco industry.

A major concern of the telco sector is the reliability of systems under environment conditions as set by the NEBS tests.

In order to keep up with the ever-increasing demands of the telco industry, and in order to provide equipment at reasonable cost and within reasonable time scales, it would be desirable to use as many off-the-shelf computer system components as possible, rather than having to design and test each system in its entirety from scratch. For example, it would be desirable to select components designed for the commercial computing sector. However, such equipment is typically not designed with the stringent requirements of the telco industry in mind. Accordingly, it is an aim of the present invention to address the provision of cost-effective equipment that can meet technical demands of the telco environments, for example as regards providing reliable operation under adverse operating temperatures, while also meeting the modern commercial demands of that environment.

SUMMARY OF THE INVENTION

Particular and preferred aspects of the invention are set out in the accompanying independent and dependent claims. Combinations of features from the dependent claims may be combined with features of the independent claims as appropriate and not merely as explicitly set out in the claims.

In accordance with one aspect of the invention, there is provided a fan control module for a system unit. The fan control module comprises power outputs for supplying power to a plurality of fan. It also includes a temperature sensor for giving a temperature signal. It further includes a control unit connected to receive the temperature signal. The control unit includes preprogrammed control information for determining power signals to be supplied to each of the fan units for controlling the speed thereof dependent upon the temperature signal.

The provision of a separate fan control module for controlling the fan units in a coordinated manner enables reliable and effective cooling of the system unit under widely varying parameters. It also means that existing system components can be employed in harsher temperature environments than they were originally designed for, without needing a complete redesign thereof.

Moreover, where the fan control module includes one or more power inputs from a power supply that is also used to power the other components of the system unit, the fan control module can be provided with electrical noise isolation circuitry to isolate other components of the system unit, from electrical noise generated by the fan units.

In order to limited the power handling requirements of the fan control module circuits, in an embodiment of the invention the fan control module can be logically split into two parts. A first part controls a first pair of fan units and the second part controls a second pair of fan units. Each part of the fan control module can be provided with respective inputs, outputs and control units. The control information programmed in the control unit of each part can be identical. Preferably, one temperature sensor is be employed by both parts to provide a co-ordinated ramp for the fan speeds. Also, where more than four fans are provided, more than two fans per part could be controlled and/or more parts could be employed, as appropriate.

The fan control module is preferably configured on a single circuit board. This provides particular advantages where the fan control card is to be provided as an addition to a system. The temperature sensor is preferably mounted on the circuit board, although it could be placed at some another part of the system as appropriate. Preferably one temperature sensor is used as this facilitates the provision of a controlled and co-ordinated ramp up of the fan speeds. However, more than one temperature sensor could be used, if desired, with each temperature sensor providing respective signals and control of the individual fans being dependent upon individual temperature signals or a function of some or all of the temperature signals.

Preferably speed signals, for supply to an alarms module, are directed via the fan control module and a power distribution board. The fan control module does not process these signals, but the feeding of the signals via the fan control module enables an efficient wiring loom to be made, with a single bundle of wires and a single connector being connected to a fan unit.

In accordance with another aspect of the invention, there is provided a system unit including a fan control module, the fan control module comprising power outputs for supplying power to a plurality of fan units, a temperature sensor for giving a temperature signal, and a control unit connected to receive the temperature signal and including preprogrammed control information for determining power signals to be supplied to each of the fan units for controlling the speed thereof dependent upon the temperature signal.

In a particular embodiment the system unit is a computer system unit including at least one processor module. It may contain anywhere between one and four processor modules. This puts further demands on the cooling requirements, as these will vary in accordance with the number of processors present. Accordingly, the power supply signals output by the control unit can be made dependent upon to the number of processor modules present.

In accordance with a further aspect of the invention, there is provided a method of controlling cooling of a system unit, the method comprising:

a fan control module receiving a temperature signal from a temperature sensor;

the fan control module determining power outputs to the fan units for controlling the speed thereof dependent upon the temperature signal from the temperature sensor and preprogrammed control information for determining power signals to be supplied to each of the fan units for controlling the speed thereof.

In the particular embodiment mentioned above, the system unit is a computer server intended to be rack-mounted for a telecommunications application. It will be appreciated that this puts further strain on the cooling requirements, due to different possible configurations of adjoining equipment in a particular installation, and the possible proximity of other heat generating elements. It will be appreciated that the present invention provides particular and important technical advantages when applied to the adaptation of systems to meet the strict reliability and temperature requirements of, for example, telecommunications applications and that it is ideally suited to such telecommunications applications.

BRIEF DESCRIPTION OF THE DRAWINGS

Exemplary embodiments of the present invention will be described hereinafter, by way of example only, with reference to the accompanying drawings in which like reference signs relate to like elements and in which:

FIGS. 10A, 10B, 10C and 10D are rear, top, front and perspective views of a power sub-frame for receiving three power supply unit.

DESCRIPTION OF THE PREFERRED EMBODIMENTS

In the following, a particular embodiment of the invention will be described by way of example only.

Figure 1:
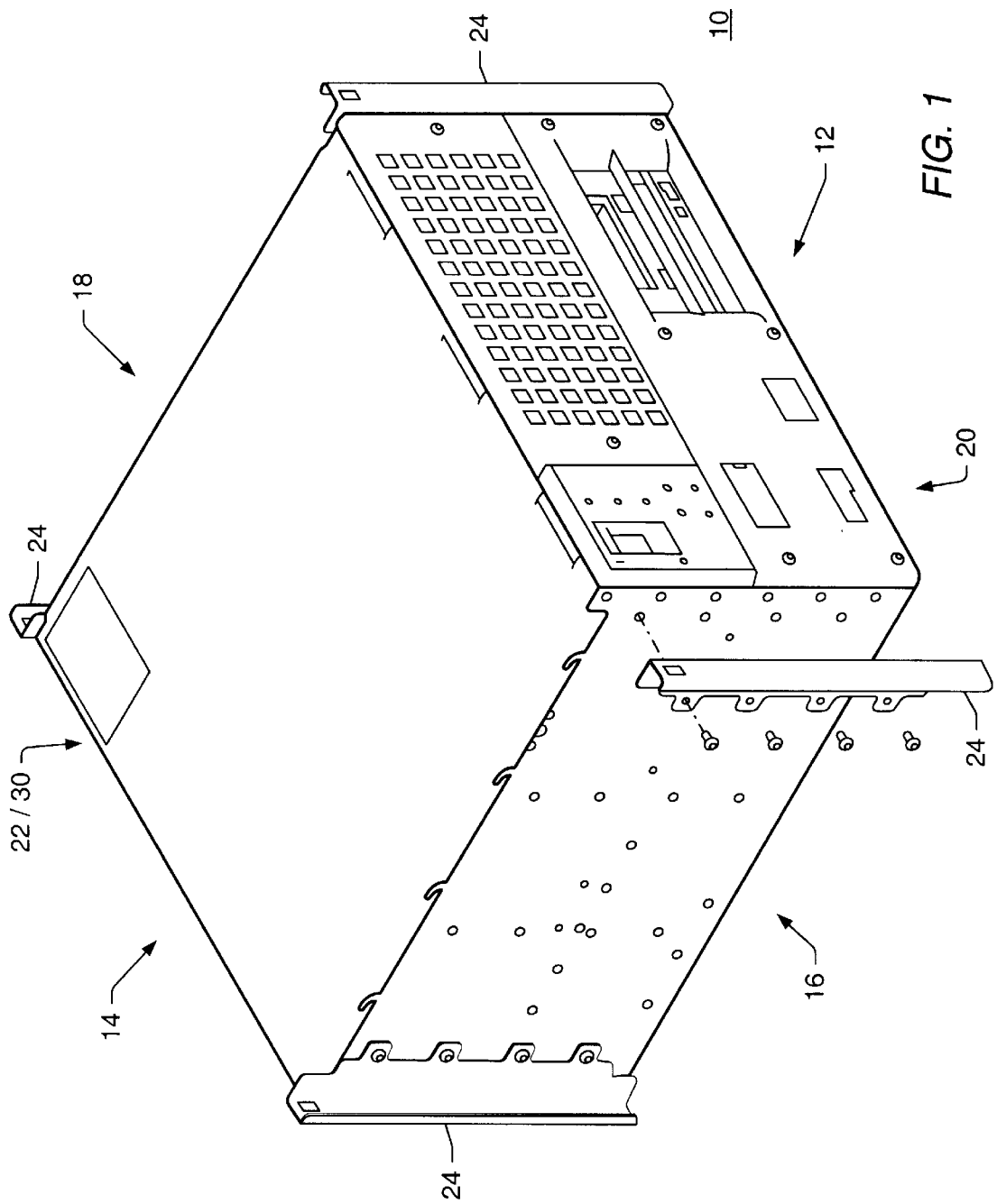
FIG. 1 is a perspective view from the front of an embodiment of the invention including sacrificial transport brackets.

FIG. 1 is a perspective view of a system unit 10 for use in a rack-mountable system. In a particular example described herein, the system unit is a computer system unit for forming a computer server for a telecommunications application, for example an Internet server. As shown in FIG. 1, the unit 10 has a front surface 12 formed by a front wall, a rear surface 14 formed by a rear wall, a left end surface 16 formed by a left side wall, a right end surface 18 formed by a right side wall, a lower surface 20 formed by a base wall and an upper surface 22, in the present example formed by a cover 30. As shown in FIG. 1, the system unit 10 is provided with sacrificial transport flanges 24, which extend above and below the system unit. This optional feature is removed before installation of the system unit 10 in a rack.

The system unit 10 is constructed with an extremely robust chassis 11, with the various walls 12–20 and the cover 30 forming the casing of the chassis 11 as well as internal walls (not shown) being formed of heavy gauge steel. The walls of the chassis can be made, for example, from electroless nickel-plated mild steel with a thickness of, for example, 1.5 to 2.0-mm.

The steel chassis 11 is pre-formed with mounting holes for the attachment of mounting flanges or a slide mechanism to enable the system unit 10 to be provided with a wide variety of mounting options and rack sizes. Mounting flanges can be provided to suit standard 19-inch, 23-inch, 24-inch or 600-mm nominal frame widths. (One inch= approximately 25.4 mm).

Figure 2A:
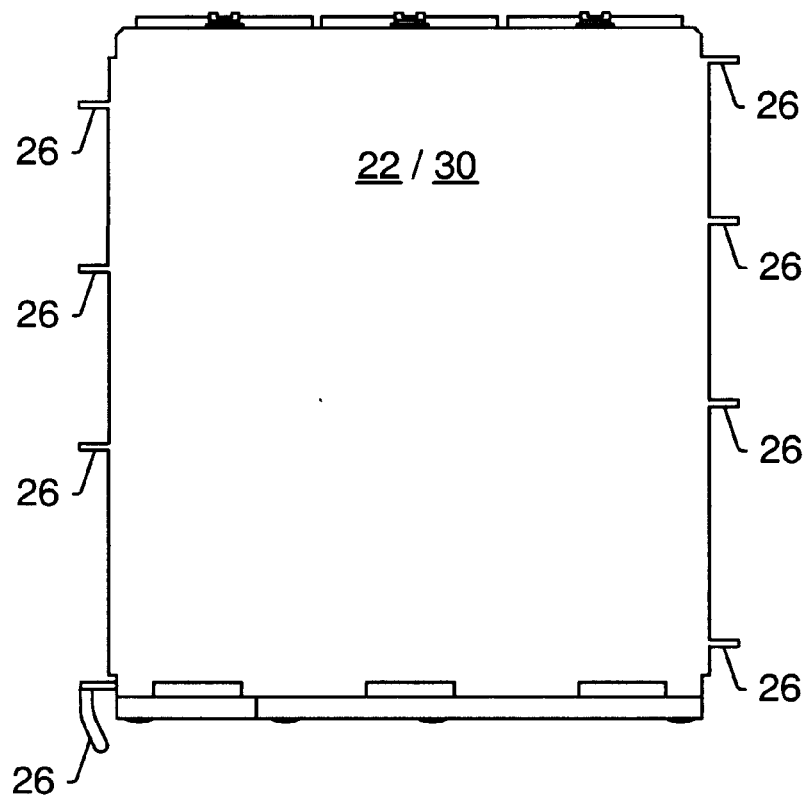
FIGS. 2A and 2B are plan and front views, respectively of the embodiment of FIG. 1 with alternative mounting brackets.

FIG. 2A is a plan view of the unit 10 showing the upper surface 22/cover 30 and various options for flanges 26 with the displacements from the front surface indicated in mm.

Figure 2B:
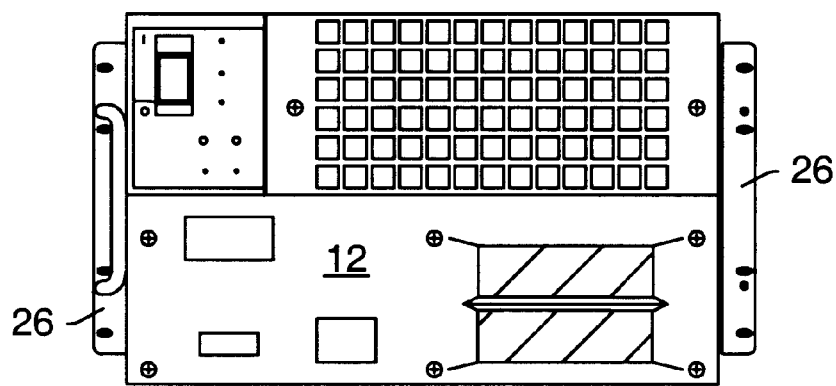

FIG. 2B is a front view of the unit 10 showing the front surface 12 and two different examples of mounting flanges 26. The mounting flange shown to the left (as seen in FIG. 2B) is provided with a handle to facilitate insertion and removal of the unit 10 from the racking system, whereas the flange 26 to the right (as viewed in FIG. 2B) is not provided with a handle.

Figure 2C:
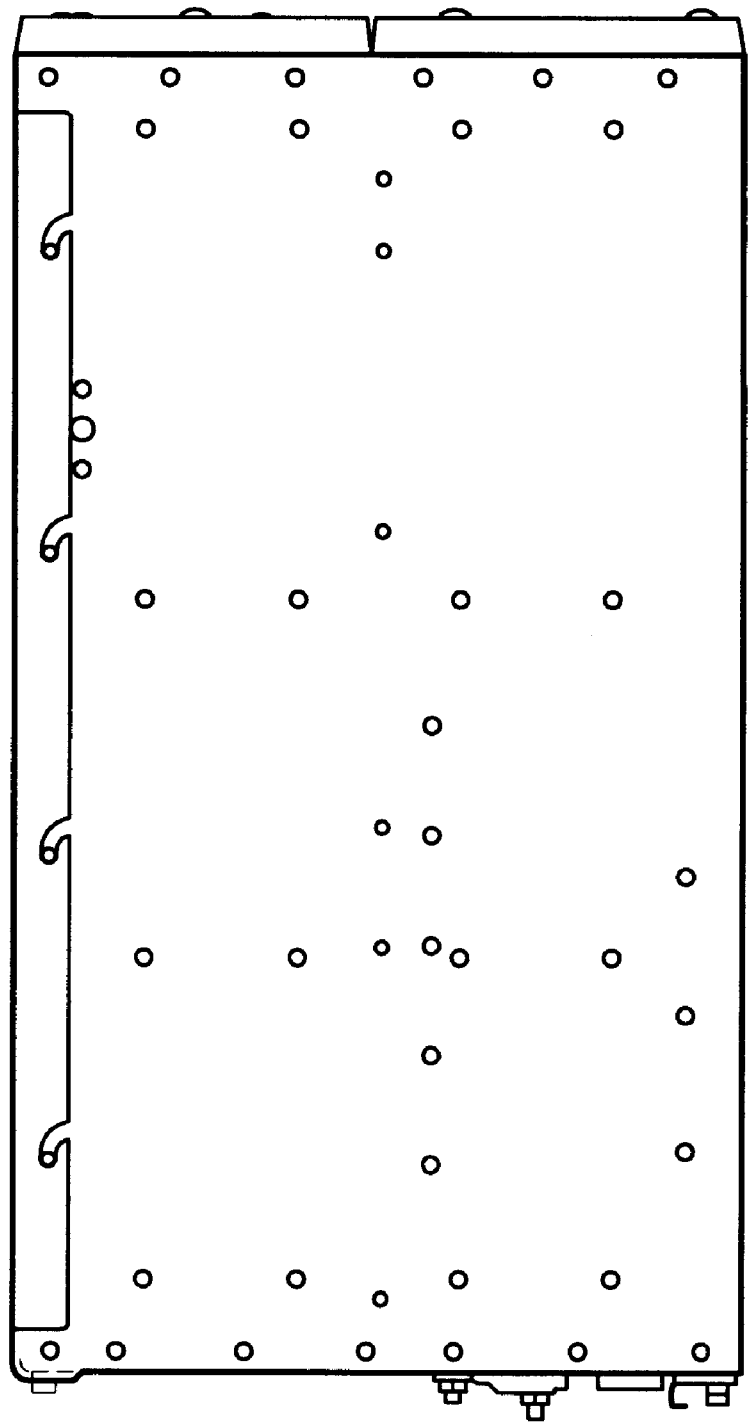
FIG. 2C is a side view showing the mounting holes for alternative types of mounting arrangements.

In the present example, the mounting flanges can be attached using screws which pass through the mounting flange into threaded holes in the end walls 14, 16 at either side of the chassis 11 of the unit 10. FIG. 2C is a side view of the system unit 10, showing the holes in the side of the system unit 10 for the mounting of flanges or a slide mechanism. Vertical rows of holes are for the attachment of flanges to be attached to vertical rack components, and horizontal rows of holes provide for the attachment of a runners for permitting a slideable mounting of the system unit in a rack.

Figure 3:
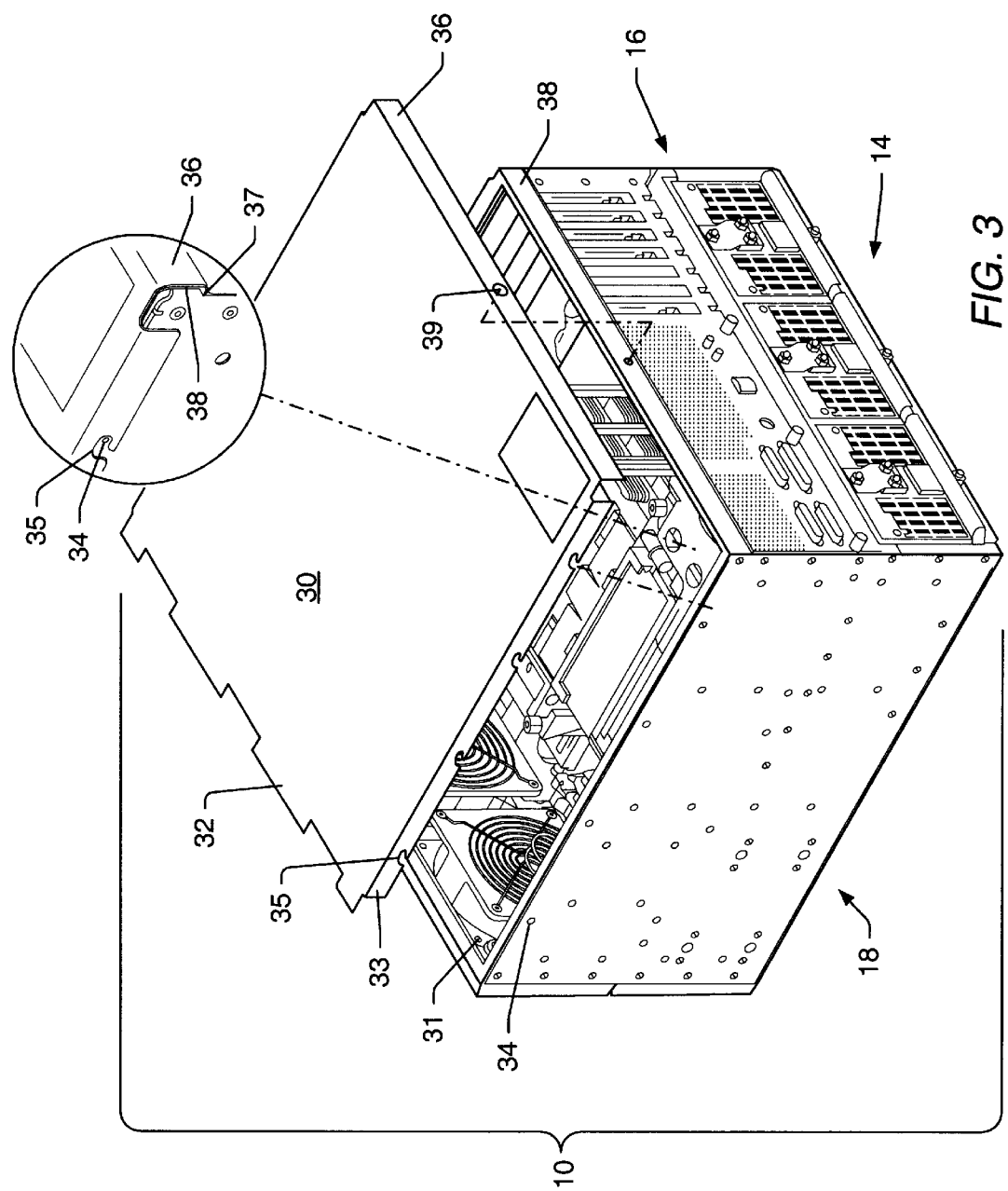
FIG. 3 is perspective view from the rear of the embodiment FIGS. 1 and 2 illustrating a removable top cover.

FIG. 3 is a perspective rear view of the unit 10 showing the cover 30 that forms the top surface 22 of the unit 10. As can be seen, the cover 30 is provided with front locating flanges 32 that, in use, engage a co-operating front flange 31 of the body of the chassis 11. Side flanges 33 engage either side of the end walls forming the left and right ends 16 and 18 of the chassis 11. Detents 34 on those end walls engage within L-shaped slots 35 in the side flanges 33 so that the cover may be lowered onto the top of the chassis 11 and then moved forwards so as to cause the detents 34 to latch within the slots 35. At the rear of the cover 30, a rear flange 36 with a lower lip 37 engages over an abutment 38 at the top of the rear end wall 14 of the casing 10. The cover can be secured to the remainder of the chassis 11 by means of a screw 39 that passes through this rear flange into a threaded hole in the abutment 38.

Figure 4:
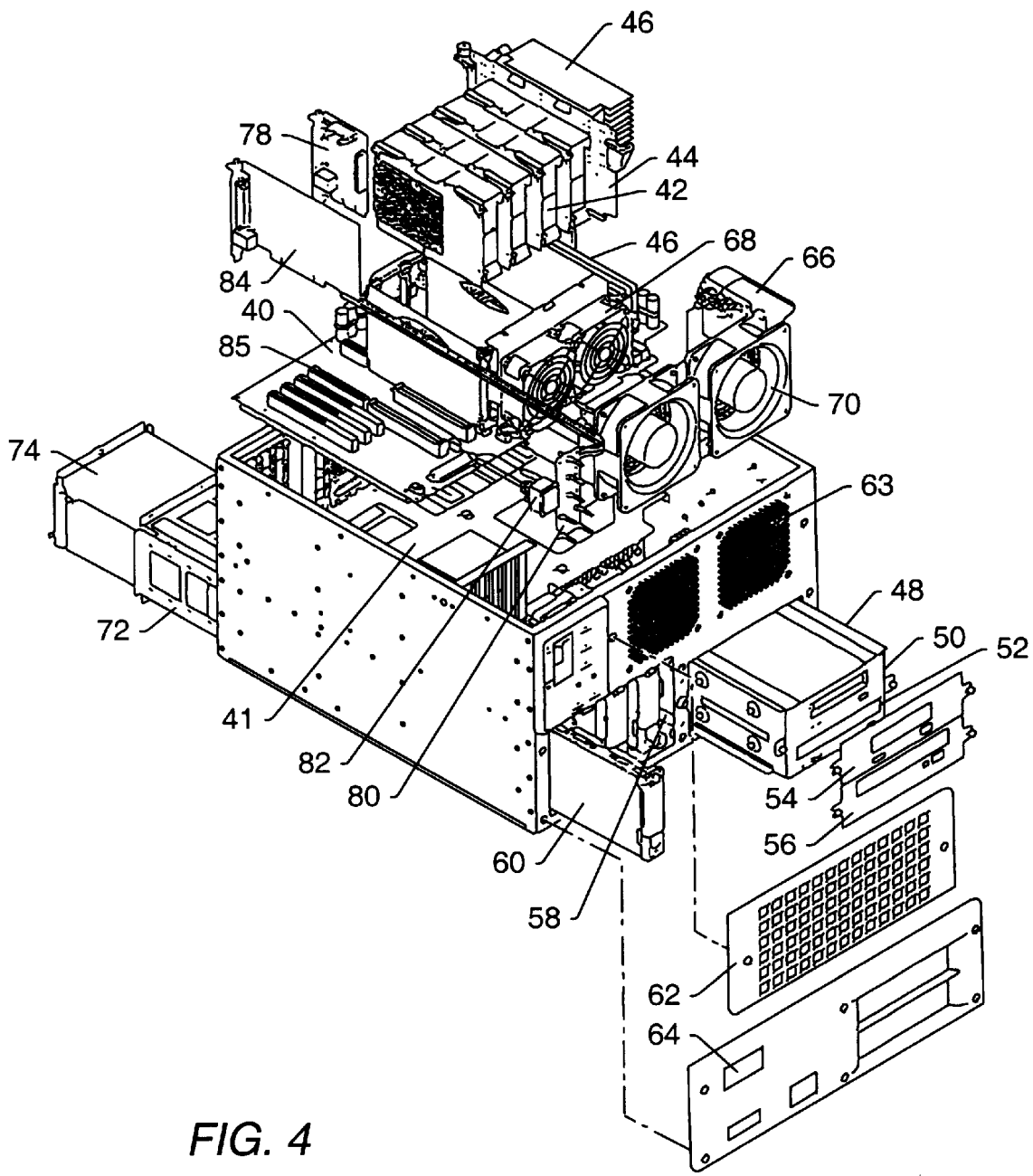
FIG. 4 is an exploded view of the aforementioned embodiment.

FIG. 4 is an exploded perspective view from the front of the system unit 10. This shows a motherboard 40 that is mounted on a horizontal mounting plane 41 within the chassis 11. Mounted on the motherboard 40 are between one and four processor modules 42. A riser card 44 can receive a plurality of dual in-line memory modules (DIMMs) 46. Further DIMMs 46 can be received directly in slots in the motherboard. A slideable carriage 48 is provided for receiving one or more media drives.

As shown in FIG. 4, the slideable carriage 48 can receive up to two media drives. In the present instance, two media drives including a digital audio tape (DAT) drive 50 and a CD-ROM drive 52 are provided. Appropriately configured metal cover plates 54 and 56 are provided for the media drives 50 and 52. A disc bay assembly 58 provides a small computer system interface (SCSI) backplane and cables for receiving one or more SCSI media drives, such as a SCSI disc drive 60. Although, in the present instance, the drives are controlled via a SCSI-type interface, it will be appreciated that another media drive interface (e.g., IDE) could be used. A SCSI card (not shown) is located within the chassis to the front of the motherboard. A bezel (decor panel) 62 is provided for covering ventilation holes 63 in the front wall 12 of the chassis 11. A bezel 64 is provided for covering the media drives 50, 52 and 60.

A fan control module 66 controls the operation of processor fans 68 and system fans 70. A power sub-assembly that includes a power sub-frame 72 with a power distribution board assembly, is provided for receiving three separate power supply units 74. An alarms module in the form of an alarms card 78 enables the signalling of alarms to the outside world, and is also connected to an LED card 2 for signalling alarms locally on the front of the unit 10. A power switch 82 is also provided on the front surface of the unit 10. FIG. 4 also illustrates one PCI card 84 to be received within a PCI slot 85 on the motherboard 40.

Figure 5:
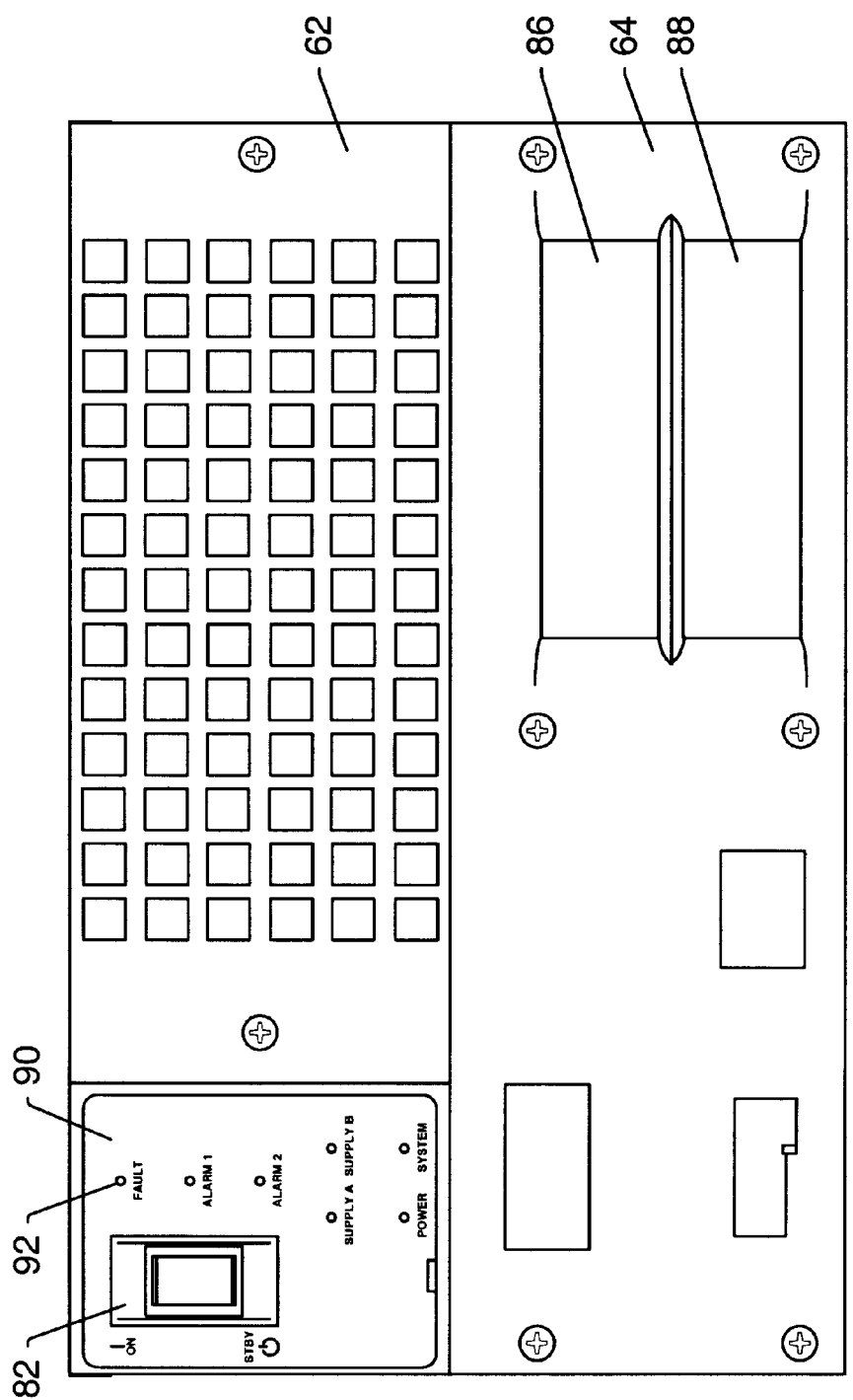
FIG. 5 is a front view of the aforementioned embodiment.

FIG. 5 is a front view of the unit 10 showing the bezels 62 and 64, a power and alarm panel 90 which includes the power switch 82 and a number of status light emitting diodes (LEDs) 92. FIG. 5 also illustrates the slots 86 and 88 for the media drives such as media drives 50 and 52 shown in FIG. 4.

Figure 6:
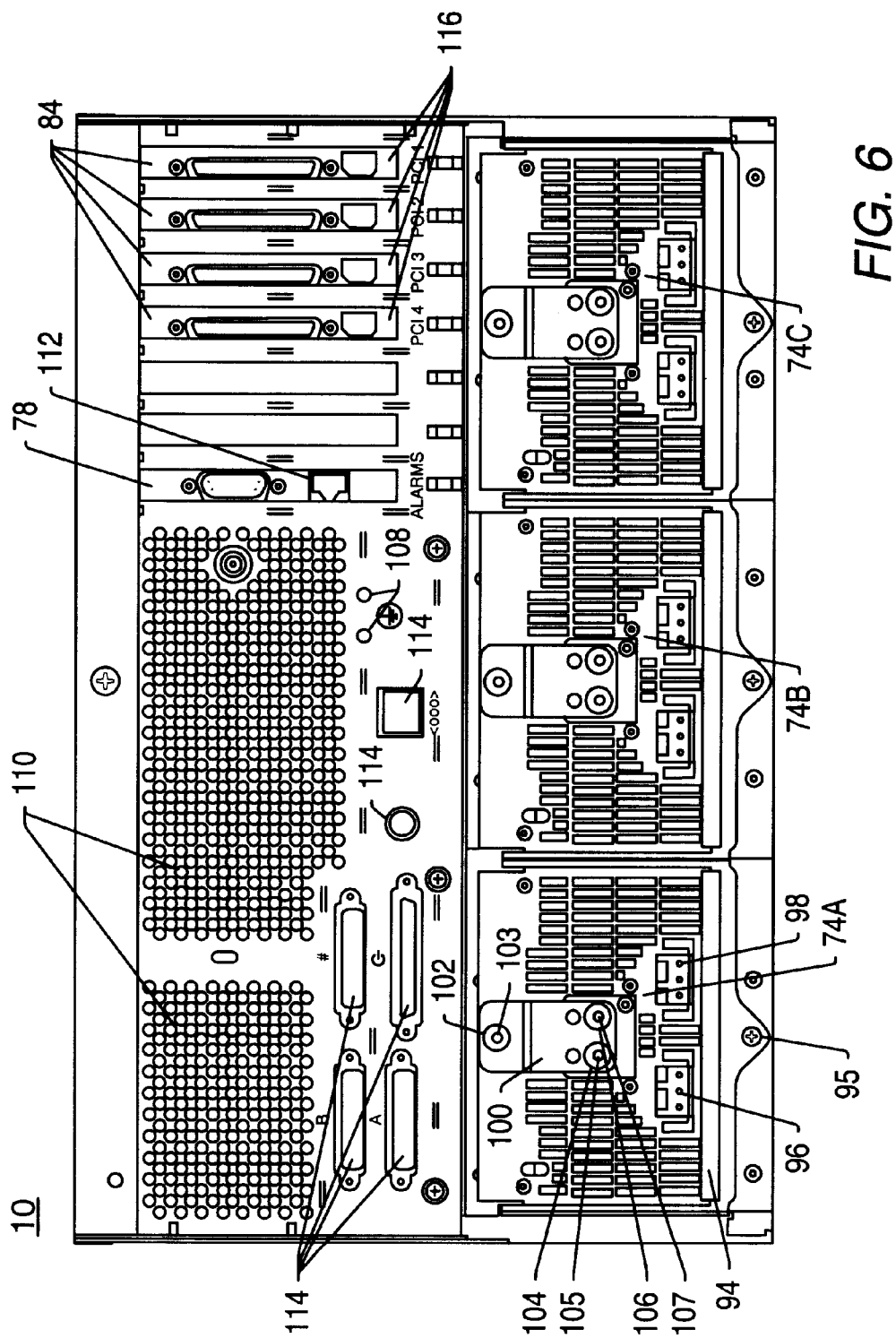
FIG. 6 is a rear view of the aforementioned embodiment.

FIG. 6 is a rear view of the unit 10 in a configuration with three DC power supply units 74A, 74B and 74C. Each of the power supply units 74A, 74B and 74C is the same, and provides redundant power for the unit 10. However, as will be seen later, one or more of the DC power supply units could be replaced by AC (mains) power supply units. The power supplies are hot swappable (i.e., while the system is running), as long as they are swapped one at a time.

With regard to power supply unit 74A, it can be seen that this is provided with a handle 94 that is used for inserting and removing the power supply unit 74A. The handle 94 includes a flange portion that is able to receive a screw 95 for securing the power supply unit to the chassis 11. First and second power cable sockets 96 and 98 are shown.

Also shown is a grounding plate 100 that is secured by knurled nuts 102, 104 and 106 to grounding studs 103, 105 and 107. Grounding stud 103 provides a connection directly to the chassis 11 of the unit 10. Grounding studs 105 and 107, on the other hand are electrically isolated from the chassis by an insulating board and are instead connected to logic ground (i.e. the ground of the electronic circuitry). By means of the grounding plate 100, logic ground can be connected directly to chassis ground. The provision of this grounding plate provides for optional tying of logic ground to chassis ground. It will be noted that each of the power supply units 74 is provided with a similar grounding plate 100, for connection to corresponding grounding studs. If it is desired to isolate logic ground from chassis ground, it is necessary to remove the grounding plate 100 from each of the power supply units 74A, 74B and 74C.

An isolated ground system is needed in some telco applications when operating in a Regional Bell Operating Company (RBOC) mode. When operating in such a mode, the chassis and logic ground are connected at a remote location to provide, for example, lightning protection. In this case two-hole lugs 101 having a pair of holes 111 to fit over the pair of grounding studs 105 and 107 are provided for each of the power supply units 74 and are secured over the studs using nuts 104 and 106. A similar two-hole lug 101 is secured to the grounding studs 108 and is secured with similar nuts. Earthing wires 109 from each of the two-hole lugs 101 on the power units and the chassis then are taken to the remote, earthing location. The studs 103 105, 107 and 108 are of a standard thread size (M5). The studs 105/107 and the studs 108 are at a standard separation (15.85 mm). The studs 105/107 are self-retaining in the insulated board on the power supply units. The stud 103 is selfretaining in the casing of its power supply unit 74. The suds 108 are also selfretaining in the system unit chassis.

In a non-isolated ground situation, chassis ground can simply be tied to a desired ground potential (for example, to the racking system) by connecting a grounding cable to grounding studs 108 provided on the rear of the chassis. A further earth connection is provided via the power cables for the power supplies.

FIG. 6 also illustrates rear ventilation holes 110 through which air is vented from the system. FIG. 6 also shows the alarms module 78 with a serial connector 112 enabling connection of the alarms module to a network for the communication of faults and/or for diagnostic operations on the unit 10 to be performed from a remote location. FIG. 6 also shows a number of PCI cards 84 received within respective PCI slots 116. A number of further external connections 114 are provided for connection of serial connections, parallel connections and SCSI connections, and for the connection of a keyboard or a Twisted-Pair Ethernet (TPE) connector.

Figure 7:
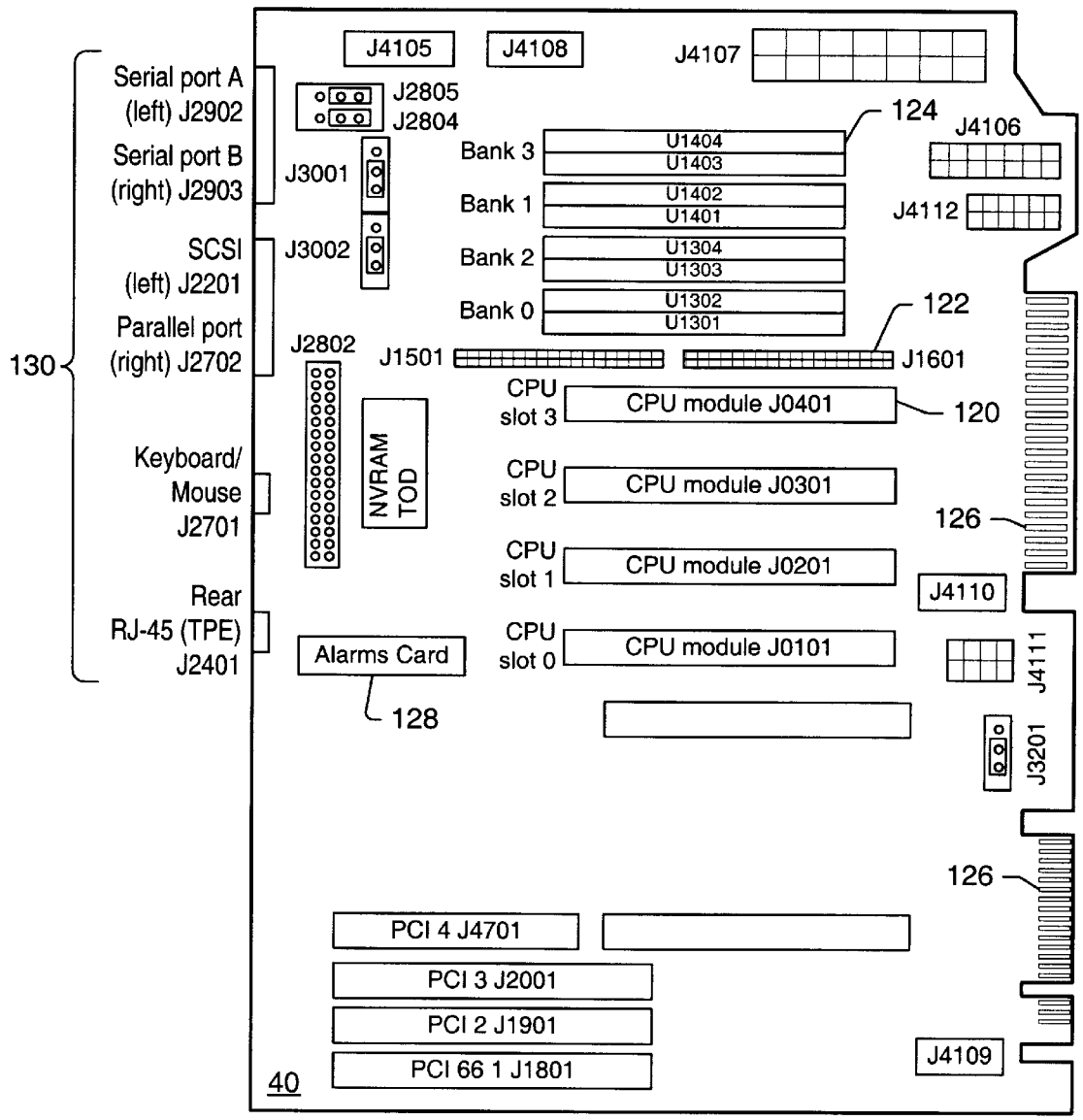
FIG. 7 is a plan view of a computer motherboard.

FIG. 7 is a plan view of the motherboard 40 shown in FIG. 4. Four CPU module slots 120 are provided. Each of these slots is able to receive one processor module 42, and any number between one and four slots may be occupied by a processor module 42. A connector arrangement 122 is provided for receiving a riser card 44 as shown in FIG. 4. Also, connectors 124 (in four banks) are provided for receiving DIMMs 46 as mentioned with reference to FIG. 4. Edge connectors 126 are provided for connecting the motherboard to connectors mounted on the mounting plane 41. Also shown in FIG. 7 is the slot 128 for the alarms module 78 and various ports 130 for the connectors 114 shown in FIG. 6.

Figure 8:
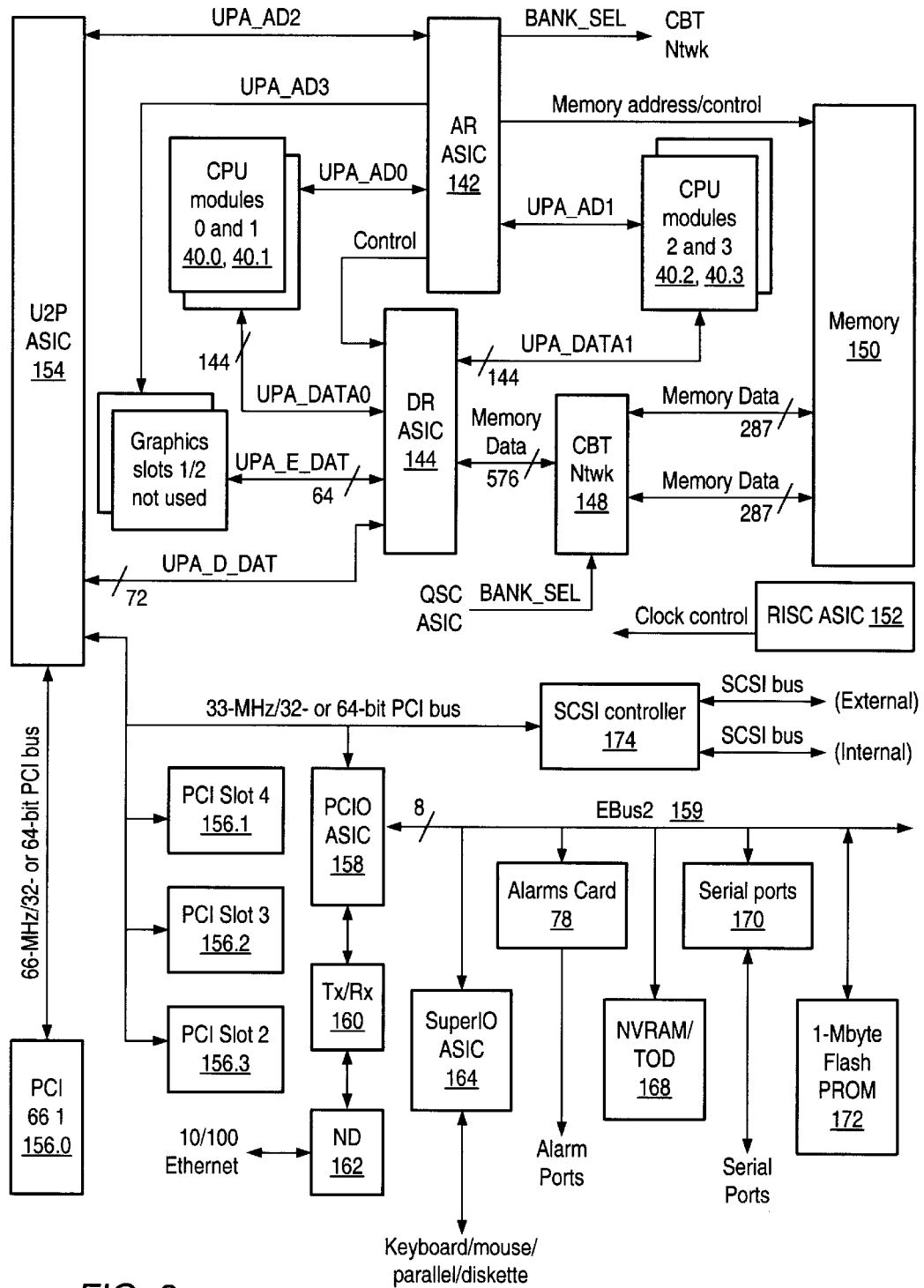
FIG. 8 is schematic block diagram of and example of the architecture of an embodiment of the invention.

FIG. 8 is a schematic overview of the computer architecture of the system 10. As shown in FIG. 8, various components within the system are implemented through application-specific integrated circuits (ASICs). The system is based round a UltraSparc Port Architecture (UPA) bus system that uses a Peripheral Component Interconnect (PCI) protocol for an I/O expansion bus. The CPU modules 40.0, 40.1, 40.2, 40.3, and a UPA-TO-PCI (U2P) ASIC 154 communicate with each other using the UPA protocol. The CPU modules 40 and the U2P ASIC 154 are configured as UPA master-slave devices. An Address Router (AR) ASIC 154 routes UPA request packets through the UPA address bus and controls the flow of data to and from memory 150 using a Data Router (DR) ASIC 144 and a switching network 148. The AR ASIC 154 provides system control. It controls the UPA interconnect between the major system components and main memory.

The DR ASIC 144 is a buffered memory crossbar device that acts as a bridge between six system unit buses. The six system unit buses include two processor buses, a memory data bus and to I/O buses. The DR ASIC 144 provides crossbar functions, memory port decoupling, burst transfer and First-in-First-Out (FIFO) data read functions. Clock control for the operation of the processor is provided by a Reset, Interrupt, Scan and Clock (RISC) ASIC 152.

The PCI bus is a high performance 32-bit or 64-bit bus with multiplexed address and data lines. The PCI bus provides electrical interconnection between highly integrated peripheral controller components, peripheral add-on devices, and the processor-memory system. A one-slot PCI bus 155 connects to a PCI device 156.0. A three-slot PCI bus connects to three PCI slots 156.1, 156.2 and 156.3. Two controllers are also connected to the second PCI bus 157. These include a SCSI controller 174 and a PCI-TO-EBus/Ethernet controller (PCIO) 158. The SCSI controller 174 provides electrical connection between the motherboard and separate internal and external SCSI buses. The controller also provides for SCSI bus control. The PCIO 158 connects the PCI bus to the EBus. This enables communication between the PCI bus and all miscellaneous I/O functions as well as the connection to slower, on board functions. Thus, the PCIO enables the connection to an Ethernet connection via a Transmit/Receive (Tx/Rx) module 161 and a network device (ND) module 162

An EBus2 159 provides a connection to various I/O devices and internal components. Super I/O 164 is a commercial off-the-shelf component that contains two serial port controllers for keyboard and mouse, an IEEE 1284 parallel port interface and an IDE disk interface. The super I/O drives the various ports directly with some electromagnetic interference filtering on the keyboard and parallel port signals. The alarms module 78 interfaces with the motherboard and provides various alarm functions. The NVRAM/TOD 168 provides non-volatile read only memory and the time of day function. Serial port 170 provides a variety of functions. Modem connection to the serial port 170 enables access to the Internet. Synchronous X.25 modems can be used for telecommunications in Europe. An ASCII text window is accessible through the serial port on non-graphics systems. Low speed printers, button boxes (for computer aided design applications) and devices that function like a mouse are also accessible through the serial port. The serial port includes a serial port controller, line drivers and line receivers. A one-Mbyte flash programmable read only memory (PROM) 172 provides read only memory for the system.

Figure 9:
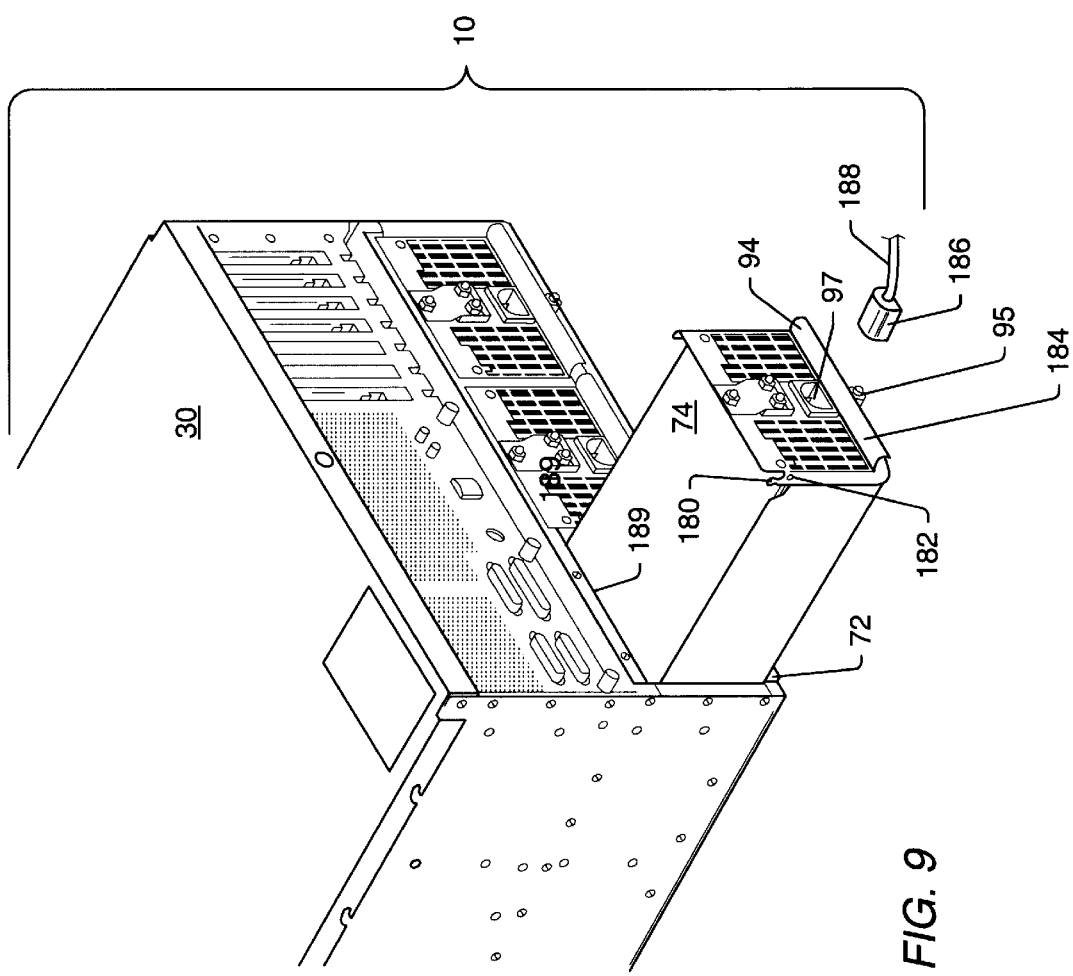
FIG. 9 is perspective view from the rear of the embodiment FIGS. 1 and 2 illustrating the removal of a power supply unit.

FIG. 9 is a perspective rear view of the system 10 showing the withdrawal and/or insertion of a power supply unit 74 in a non-isolated ground situation. In this example, AC power supply units 74 are shown. It can be seen that the power supply unit 74 is provided with the handle 94. As shown in FIG. 9, the handle 94 is provided with a grip 184, a pivot 182 and a latch 180. To insert the power supply unit 74 it is necessary to slide the power supply unit into the power sub-frame 72 with the grip 184 of the handle 94 slightly raised so that the detent 180 can be received under the top 184 of the power sub-frame 72. As the power supply unit 74 reaches the end of its movement into the power sub-frame 72, connectors (not shown) provided on the power supply unit 74 make connection with a corresponding connector on the power distribution board at the rear of the power sub-frame 72. Also, at this time, the handle can be pushed down into the position shown in FIG. 9. This causes the detent 180 to latch behind the upper portion 184 of the power sub-frame 72. The handle 94 can then be secured in place by tightening the screw 95. The AC power supply unit 74 shown in FIG. 9 has a single power socket 97, whereas the DC power supply units 74 shown in FIG. 6 have two power sockets 96 and 98. Irrespective of whether the arrangement is as shown in FIG. 6 with two DC power sockets 96 and 98, or as shown in FIG. 9 with one AC power socket 97, the configuration of the power socket(s) and the lever 94 is such that the lever cannot be moved, and therefore the power supply unit cannot be released from the power sub-frame 72 and the chassis 11 with a plug 186 of a power cable 188 in place in one of the power sockets 96/97/98. The removal operation is achieved by releasing the screw 95, removing the power plug, and lifting and pulling on the handle 94.

In an isolated ground situation, in order to hot-swap a power supply unit 74, it is merely necessary to remove the two-hole lug 101 with its connecting earth wire 109 from the studs 105, 107 of the power supply unit to be removed, to remove the old power supply unit 74, to replace a new power supply unit 74 and then to reconnect the two-hole lug 101 and connecting earth wire 109 to the studs 105, 107 of the new power supply unit 74. These operations can all be performed with the system under power from the other power supply units 74 and with the two-hole lugs 101 and earth wires 109 in place over the chassis studs 108 and the studs 105, 107 of the other power supply units 74.

The isolated ground situation is not shown in FIGS. 6 and 9. In the non-isolated ground situation shown in FIGS. 6 and 9, hot-swapping of a power supply unit is even easier, as it is merely necessary to remove the selected power supply unit 74 and to replace it with the new power supply unit 74.

FIGS. 10A, 10B, 10C and 10D are rear, top, front and perspective views of a power sub-frame for receiving three power supply units:

The power sub-frame 72 comprises a rectangular, box-shaped frame 191, with four exterior walls on four sides (the top, bottom and two lateral surfaces), one open side 195 for receiving three power supply units and a power distribution circuit board 190 opposite to the open side. In the present instance, the walls are made of electroless nickel-plated mild steel.

FIG. 10A shows the power distribution board at the "rear" of the power sub-frame (i.e. opposite to the open side). When inserted in the chassis of the system unit, this "rear" of the power sub-frame is actually the forward-most side of the power sub-frame when viewed with respect to the system unit. The power distribution board 190 is formed with ventilation holes 194 and carries circuit tracks and components (not shown). FIG. 10A also illustrates the flanges 198 with screw holes 199 for securing the power sub-frame to the rear chassis wall. FIG. 10B shows the top of power sub-frame. It will be noted that the power sub-frame body 196 is provided with apertures 197 for lightness and for ventilation purposes.

FIG. 10C shows the open (front) side 195 (see FIG. 10B) of the power sub-frame. When inserted in the chassis of the system unit, this "front" of the power sub-frame is actually the rear-most side of the power sub-frame when viewed with respect to the system unit. Within the power sub-frame 72, connectors 192A, 192B and 192C for the three power supply units 74A, 74B and 74C, respectively, can be seen. These connectors are mounted on the power distribution board 190 inside the power sub-frame 72. FIG. 10C also shows the flanges 198 with screw holes 199 for securing the power sub-frame to the rear chassis wall.

Figure 10D:
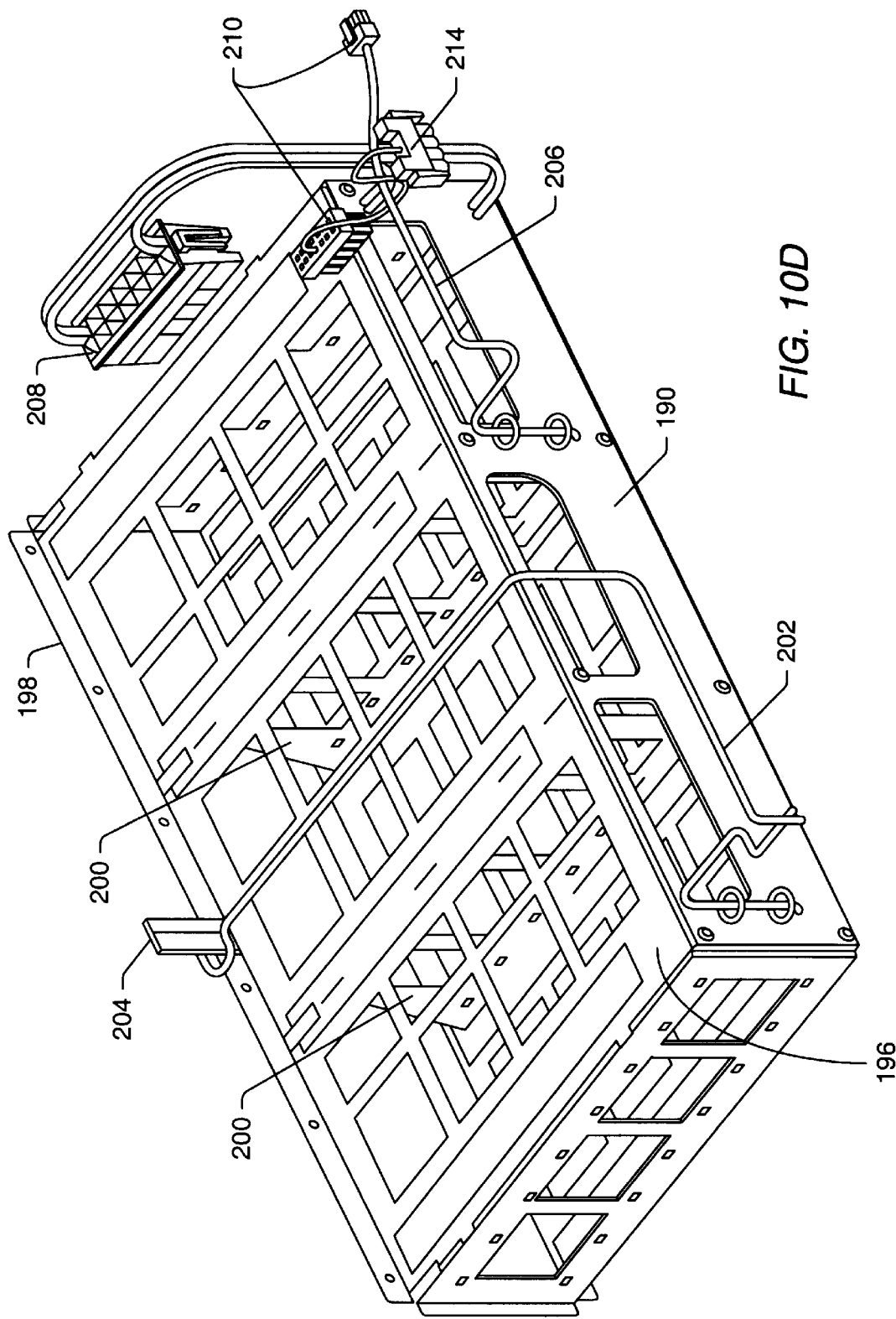
Figure 10E:
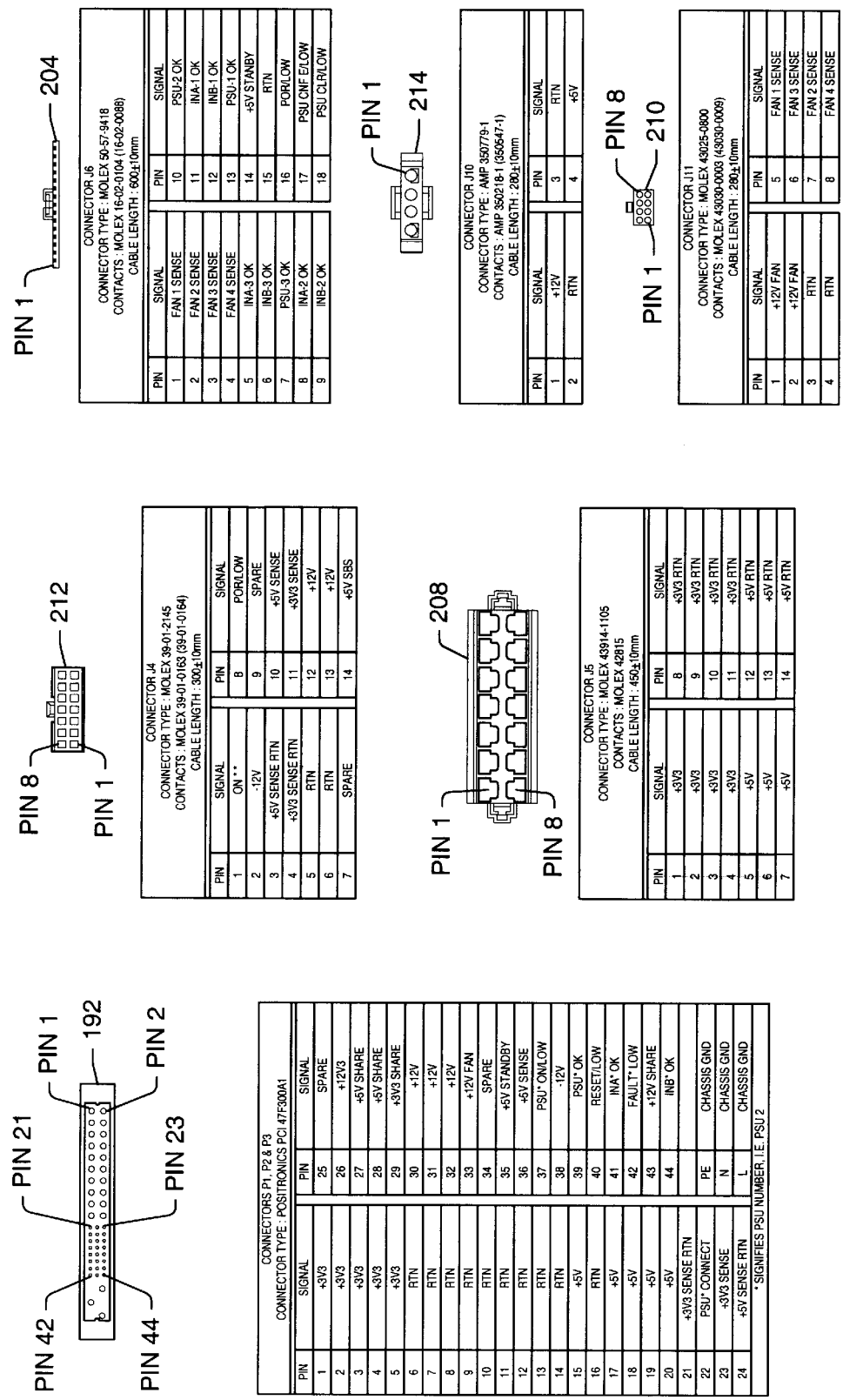
FIG. 10E illustrates connections for various connectors of a power sub-frame assembly.

FIG. 10D is a perspective view of the power sub-frame 72, which shows that this in fact forms part of a power sub-assembly 71. Internal walls 200 separate three compartments, each for a respective one of the three power supply units 74. Cables 202 connect standby power and signal lines from the power distribution board 190 to a connector 204 for connection to an alarms module. Cables 206 connect main power and signal lines from the power distribution board 190 to various connectors 208, 210, 212 and 214. FIG. 10E shows the various connector types 192, 204, 208, 210, 212 and 214 and the electrical signal connections thereto.

Figure 11:
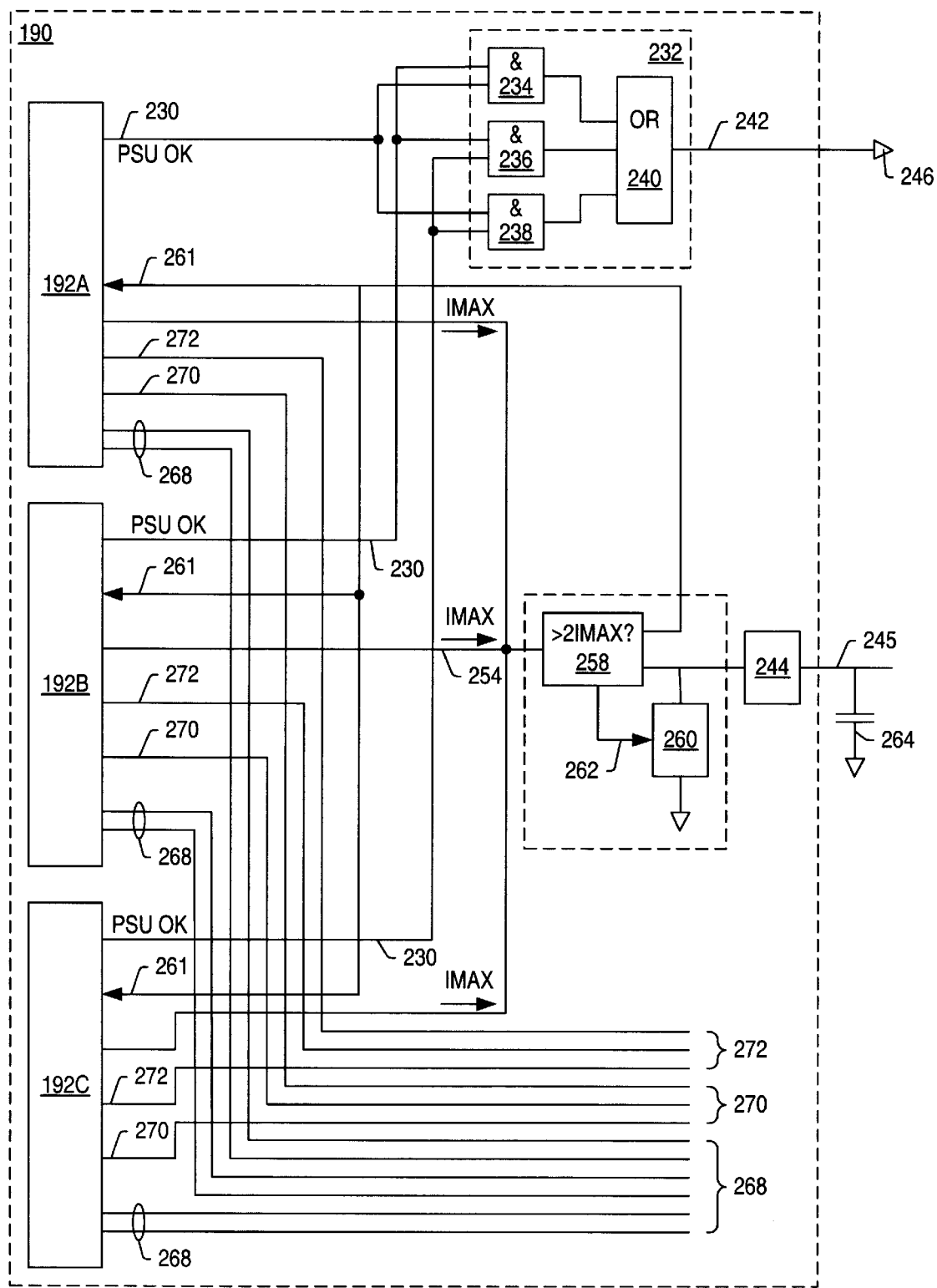
FIG. 11 is a schematic diagram of circuitry from a power distribution board of the power sub-frame of FIG. 10.

FIG. 11 is a schematic representation of some of the logic connections on the power distribution board. For ease of explanation, only those connections relevant for an understanding of the present invention are described.

At the left of FIG. 11, the three connectors 192A, 192B and 192C for the three power supply units 74A, 74B and 74C are shown. For reasons of clarity and convenience only those connections relevant for an understanding of the present invention as shown. For example, as illustrated with respect to FIG. 10E, the connectors 192 have many pins and pass many signals via respective lines. However, as not all of these lines are necessary for an understanding of the present invention, and as it would be confusing to illustrate all of the signal pathways on a diagram, only selected pathways are shown in FIG. 11. It is to be noted from FIG. 10E, that the power supply units output ground, +3V3, +5V, +12V, −12V and +5V standby potentials as well as control signals such as PSU OK, PSU ON, etc. The +5V standby voltage is used for powering the alarm module 78. The other voltages are for powering the motherboard and other main system components. The various lines could be configured using bus bars, wires, printed circuit or thick film conductors as appropriate.

Firstly, the two-of-three circuit 232 will be explained. This circuit is powered by the +5V standby voltage 231 provided from each of the power supply units 74. Each of the power supply units outputs a PSU OK signal via a pin on its respective connector to a corresponding PSU OK line 230A, 230B and 230C when the power supply unit is operating correctly. Each of these PSU OK lines 230 is connected to the two-of-three circuit 232. This comprises three AND gates 234, 236 and 238, each for comparing a respective pair of the PSU OK signals. The outputs of the AND gates are supplied to an OR gate 240.

If the output of this OR gate is true, then at least two of the power supply units 74 are operating correctly, and power can be supplied to the motherboard of the computer system. This can be achieved by closing the main power line 245. An output signal 242 could be supplied to a gate 244 (for example a power FET) to enable current to pass to the motherboard and other system components. Additionally, or alternatively, a power OK signal 246 for controlling some other form of switch mechanism (not shown).

If alternatively the output of the OR gate 242 is false, then this indicates less than two of the power supply units 74 are operative. In this case power is prevented from being passed to the motherboard 40 of the computer system. This can be achieved by interrupting the main power line 245. An output signal 242 could be supplied to a gate 244 (for example a power FET) to prevent current being passed to the mother-board and other system components. Additionally, or alternatively, a power fault signal 246 could be passed to the alarms module and/or for controlling some other form of switch mechanism (not shown).

One-of-three power control is effectively provided by the alarms module 78 to be described later. However, with reference to FIG. 11, input A/B signals 268 and output sense signals 270 are passed to the alarms module for standby operation, and control signals 272 could be returned for turning off of a power supply unit, if required.

FIG. 11 further illustrates a protection circuit 256 that is able to detect an overcurrent representative of a current greater than 2*Imax, where Imax is the maximum current that can be output by a power supply, 2*Imax being the maximum current which should be required by the system unit. If a current greater than 2*Imax is detected, this is representative of a fault in the system unit. In accordance with telco requirements, in such a situation the system should be powered down. By providing for overcurrent detection on the power distribution board, where the maximum drawable current should be 2*Imax, it is possible to test for a fault at a lower overall current than if this test were made within each power supply unit. If the test were made in each power supply unit, each power supply unit would need to be tested for an overcurrent in excess of Imax, whereby one would be testing for a total current drain of 3*Imax. This could lead to faults not being detected or not detected early enough and the system could incorrectly be drawing up to 3*Imax, which could damage components and traces (tracks).

Thus, as shown in FIG. 11, each of the main power lines (e.g., +12V) 250A, 250B and 250C from the power supply units 74A, 74B and 74C, respectively is connected to form a common power supply line 254. An overcurrent detector 258 detects a current in excess of 2*Imax. If such a current is detected (for example as a result of a fault represented by the box 266), then a signal 261 is provided to the connectors 192A, 192B and 192C for shutting down the power supplies 74A, 74B and 74C, respectively. Also, a signal 262 is passed to a switchable shunt 260 (e.g., a silicon controlled rectifier (SCR), a Metal Oxide Semiconductor Field Effect Transistor (MOSFET), an Insulated Gate Bipolar Transistor (IGBP), etc) to shunt the power supply line 254 to ground. This will cause any energy stored in the power supplies and also in the system (for example as represented by the capacitor 264) to drain to ground, thus protecting the system.

The use of the two-of-three circuit described above means that redundant power supply operation is provided in that the system can remain powered even if one of the three power supply units fails. As only two-of-three power supply units are needed to power the system the third power supply unit can be hot swapped while the other two power supply units power the system.

FIG. 11 illustrates the location of an alarms card forming the alarms module 78 in the rear of the system unit 10.

Figure 12:
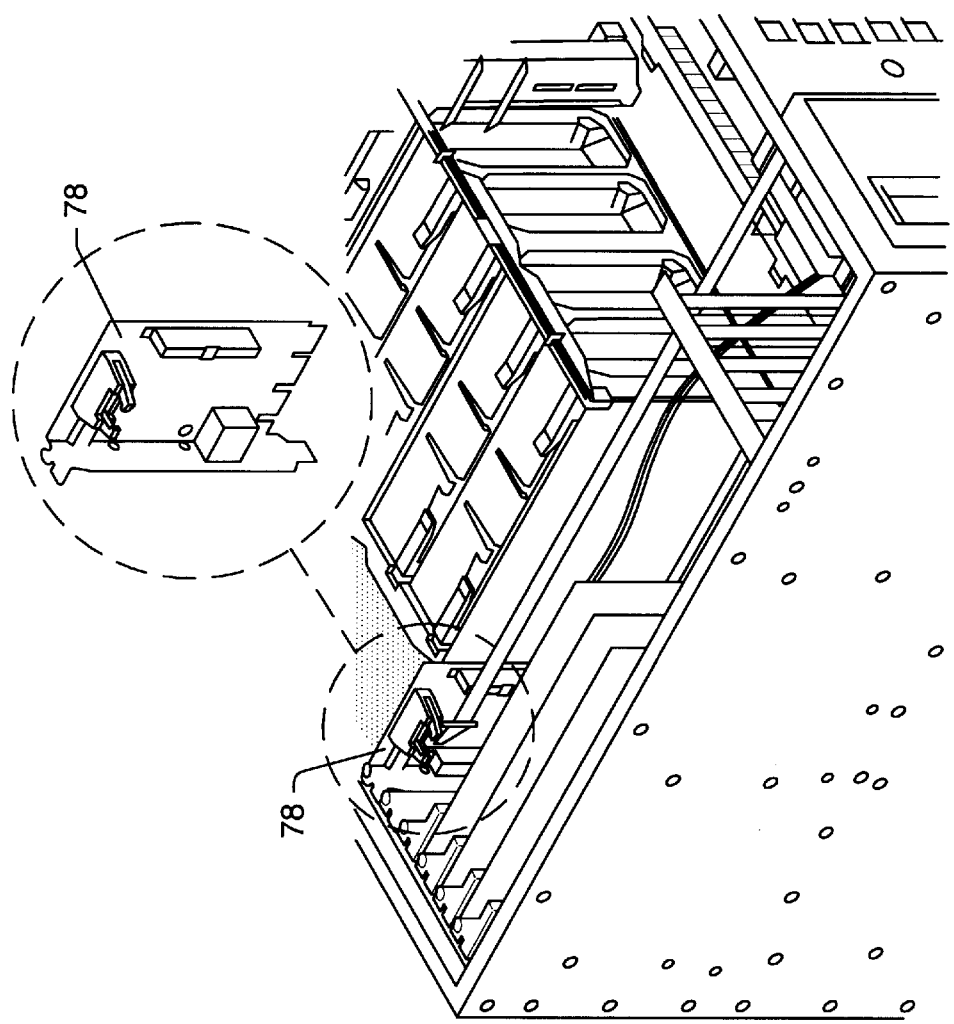
FIG. 12 illustrates the location of an alarm circuit.

FIG. 12 is a functional block diagram for illustrating the alarm sub-system on the alarms module 78. The alarms sub-system provides lights out management or remote management of the system over a serial connection. The alarms module 78 interfaces with the motherboard through an EBus edge connector slot 298 (connected to EBus2 as shown in FIG. 8). A PCI-style bracket is attached to one edge of the alarms module (as seen in FIG. 11) and provides the external interfaces at the rear of the chassis 11. Internal interfaces provide connections to the power supply assembly and to the LED card 80 located at the front panel of the system unit 10.

The alarms module is powered by the standby, or reserve, power supply. The alarms module only requires power from a single power supply to remain operable. Accordingly, the alarms module can remain operable even in a situation where the system has been powered down due to there being only one power supply unit operable.

The alarms sub-system comprises a logic device 280 which receives inputs 298 from the EBus, inputs 286 from the fans, input 290 from general purpose events, input 270 from the power supply unit output rails and inputs 268 from the A and B power inlets. The logic circuit samples, or multiplexes, the inputs to the microcontroller 296 in response to multiplex signals from the microcontroller 296. The microcontroller 296 processes the sampled (multiplexed) inputs. The microcontroller 296 provides power control signals 272 for controlling the power supply units, and alarm outputs for the output of alarm signals. The microcontroller 296 also outputs power supply unit status signals 304 and fault signals 306. The micro controller 296 can further output a system reset signal 310, when required. Alarm signals to be passed to a remote location can pass via a remote serial connection 112. Diagnostic and remote control signals can be passed from the network via the serial connection 112 to the microcontroller 296. Control signals can thus be provided via the remote serial connection over the network for powering on and powering off the system. Examples of other commands that can be sent to the microcontroller via the remote serial connection 112 are to turn alarms off, to reset the monitoring of all failures, to display the status of all fans, power supply units, alarms and fault Light Emitting Diodes (LEDs), to display an event log, etc.

The microcontroller is programmed to report any fan failures or changes in power supply units status by means of the LEDs 92 (FIG. 5) on the system front and optionally to report the faults via the remote serial connection 112. The microcontroller 296 is programmed to maintain the event log that was referenced above.

Figure 14:
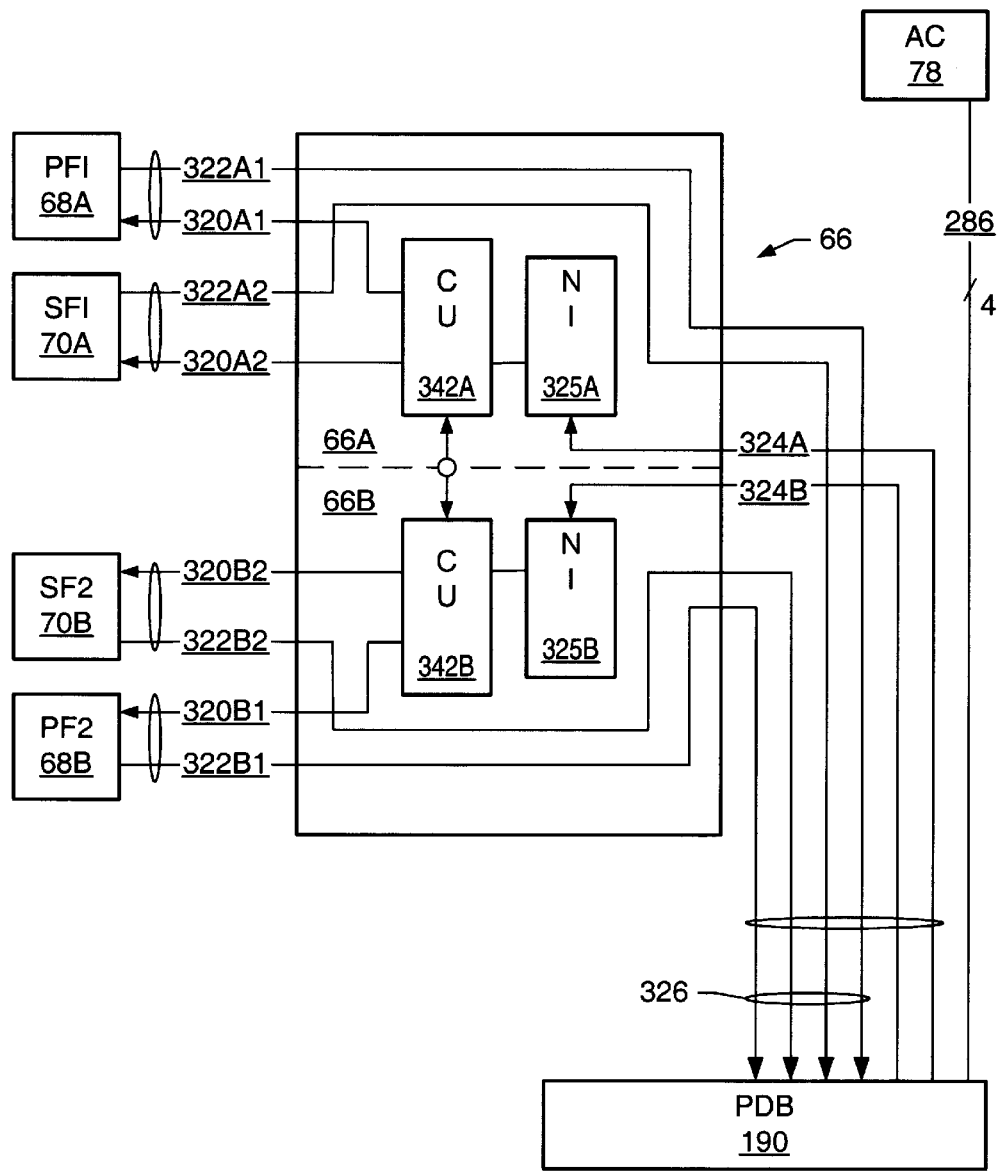
FIG. 14 is a schematic diagram illustrating the configuration of a fan control module.

FIG. 14 illustrates the configuration of the fan control module 66 shown in FIG. 4. The fan control module is subdivided into two halves 66A and 66B. One half 66A handles one processor fan 68A and one system fan 70B and the other half 66B handles the other processor fan 68B and the other system fan 70B. The fans are connected to the fan control module 66 by respective power lines 320 so that the fans receive their power via the fan control module. The fan control module receives +12V power via power lines 324A/B from the power distribution board 190 and supplies voltages to the fans via the power lines 320 in a controlled manner.

Figure 13:
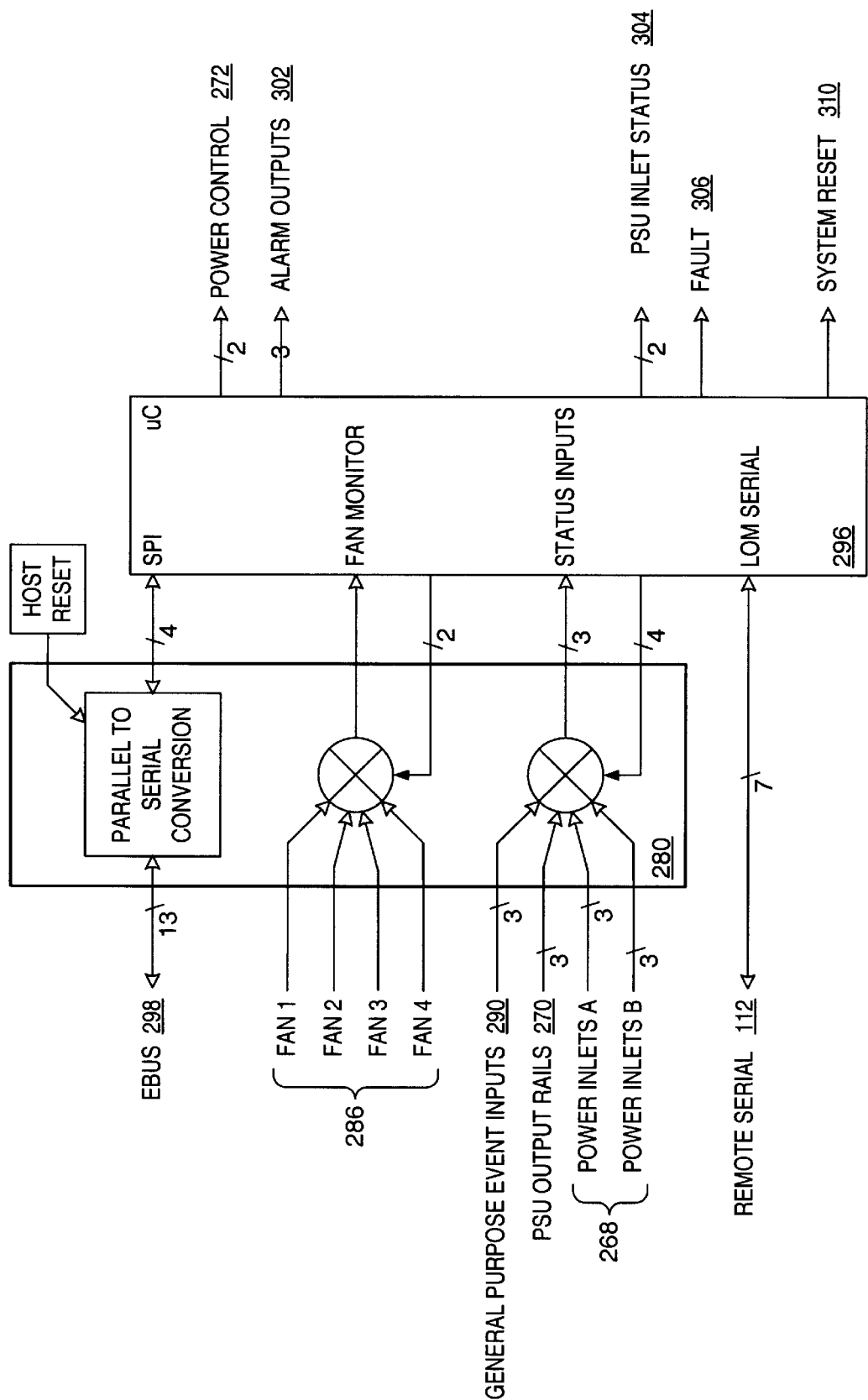
FIG. 13 is a schematic block diagram of the logic of the alarm circuit.

For convenience, tacho (speed) signals from the fans pass via the alarms control module 66. The speed signals are not processed by the fan control module, but are instead forwarded via tacho sense 326 to the power distribution board 190. The power distribution board then routes the tacho sense signals to the alarms module 78 to form the signals 286 shown in FIG. 13. This routing is convenient as it enables simpler wiring looms to be used. Also, when replacing a fan unit, the maintenance engineer only needs to remove a single bundle of wires from the fan to the fan control module 66, rather than having to locate a number of different connectors connected to the fan. The fan control module thus has four fan connectors, each for receiving a connector connected to a bundle of wiring from a respective fan, plus a further connector for receiving a connector with a bundle of wires from the power distribution board.

As shown in FIG. 14, each half 66A/66B of the fan control module receives respective power lines 324A/B from the power distribution board. Each half of the fan control module includes electrical noise isolation circuitry 340A/B. This electrical noise isolation circuitry 325 A/B, which can be of conventional construction, prevents dirty power signals on the lines 320A/B caused by electrical noise from the fans being passed back along the power lines 324A/B and potentially contaminating the otherwise clean power supply to the electronics of the system unit (e.g., the components on the SCSI bus. The provision of clean power supply signals in a telco application is important in order to ensure reliability of operation. Although in the present example the noise isolation circuitry is located in the fan control module, it could be located elsewhere as long as it is effective to isolate the main power lines from fan-related electrical noise.

As further shown in FIG. 14, each side 66A/B of the fan control module comprises control logic 342A/B which receives a temperature signal from a temperature sensor 344 and adjusts the speed of the fans by adjusting the voltage supplied thereto in accordance with pre-programmed parameters in order to provide a desired degree of cooling. The control logic 342A/B can be implemented by an ASIC, a programmable logic array, or any other appropriate programmable logic. Alternatively, it could be implemented by software running on a microcontroller or microprocessor module.

It should be noted that the fan control module could be implemented in a unitary manner, rather than being divided into two halves. Although in the present instance the fan control module is preferably configured on a single circuit board, this need not be the case. Also, although the temperature sensor is also mounted on the same circuit board, it could be mounted elsewhere. Moreover, although it is preferred that a single temperature sensor is used, with the advantage that the fan speeds of the respective fans can be ramped up in parallel in a controlled manner, more than one temperature sensor could be used. Ideally, in this case they would be located close together and control of the individual fans could be dependent on individual signals but would more preferably be dependent on a function of some or all of the temperature signals. As a further feature, the control logic could be provided with different sets of programmed parameters depending on the number of processors present and could be responsive to the number of processors present.

It will be appreciated that although particular embodiments of the invention have been described, many modifications/additions and/or substitutions may be made within the spirit and scope of the present invention. Accordingly, the particular example described is intended to be illustrative only, and not limitative.

What is claimed is:

1. A fan control module for a system unit, the fan control module comprising power outputs for supplying power to a plurality of fans, a temperature sensor for giving a temperature signal, and a control unit connected to receive the temperature signal and including preprogrammed control information for determining power signals to be supplied to each of the fans for controlling the speed thereof dependent upon the temperature signal; and wherein speed signals from each of the fans are driven via the fan control unit to a power distribution board and an alarms card.

2. The fan control module of claim 1, comprising at least one power input for receiving power from a power supply, the fan control module including electrical noise isolation circuitry to isolate system components from electrical noise generated by the fans.

3. The fan control module of claim 1, comprising a first part for controlling a first pair of fans, the first part comprising respective first power outputs for supplying power to the first pair of fans, and a first control unit connected to the temperature signal from the temperature sensor and including first preprogrammed control information for determining first power signals to be supplied to each of the first pair of fans for controlling the speed thereof dependent upon the temperature signal; and a second part for controlling a second pair of fans, the second part comprising respective second power outputs for supplying power to the second pair of fans and a second control unit connected to the temperature signal from the temperature sensor and including second preprogrammed control information for determining second power signals to be supplied to each of the second pair of fans for controlling the speed thereof dependent upon the temperature signal.

4. The fan control module of claim 3, wherein the first and second information is identical.

5. The fan control module of claim 3 comprising one power input for receiving power from a power supply for the first part, the first part including first electrical noise isolation circuitry to isolate system components from electrical noise generated by the first pair of fans, and a second power input for receiving power from a power supply for the second part, the second part including second electrical noise isolation circuitry to isolate system components from electrical noise generated by the second pair of fans.

6. The fan control module of claim 3, wherein a first fan of each pair of fans is a system fan for drawing air into the system unit and a second fan of each pair of fans is a processor fan for driving air over a processor module in the system unit.

7. The fan control module of claim 1, wherein a first fan is a system fan for drawing air into the system unit and a second fan is a processor fan for driving air over a processor module in the system unit.

8. The fan control module of claim 1, configured on a circuit board.

9. A system unit including a fan control module, the fan control module comprising power outputs for supplying power to a plurality of fans, a temperature sensor for giving a temperature signal, and a control unit connected to receive the temperature signal and including preprogrammed control information for determining power signals to be supplied to each of the fans for controlling the speed thereof dependent upon the temperature signal; and wherein speed signals from each of the fans are driven via the fan control unit to a power distribution board and an alarms card.

10. The system unit of claim 9, wherein a first fan of a pair of fans is a system fan for drawing air into the system unit and a second fan of a pair of fans is a processor fan for driving air over a processor module in the system unit.

11. The system unit of claim 9, wherein the fan control module is configured on a circuit board.

12. The system unit of claim 9, wherein the fan control module comprises at least one power input for receiving power from a power supply, the fan control module including electrical noise isolation circuitry to isolate the power supply from electrical noise generated by the fans.

13. The system unit of claim 12, wherein the fan control module comprises one power input for receiving power from a power supply for the first part, the first part including first electrical noise isolation circuitry to isolate system components from electrical noise generated by a first pair of fans, and a second power input for receiving power from a power supply for the second part, the second part including second electrical noise isolation circuitry to isolate system components from electrical noise generated by a second pair of fans.

14. The system unit of claim 9, wherein the fan control module comprises a first part for controlling a first pair of fans, the first part comprising respective first power outputs for supplying power to the first pair of fans and a first control unit connected to receive the temperature signal from the temperature sensor and including first preprogrammed control information for determining first power signals to be supplied to each of the first pair of fans for controlling the speed thereof dependent upon the temperature signal; and a second part for controlling a second pair of fans, the second part comprising respective second power outputs for supplying power to the second pair of fans and a second control unit connected to receive the temperature signal from the temperature sensor and including second preprogrammed control information for determining second power signals to be supplied to each of the second pair of fans for controlling the speed thereof dependent upon the temperature signal.

15. The system unit of claim 14, wherein the first and second information is identical.

16. The system unit of claim 9, wherein the system unit is a computer system unit including at least one processor module.

17. The system unit of claim 16, including up to four processor modules.

18. The system unit of claim 16, wherein the signals output b of the control unit is dependent upon the number of processor modules present.

19. The system unit of claim 9, wherein a first fan is a system fan for drawing air into the system unit and a second fan is a processor fan for driving air over a processor module in the system unit.

20. The system unit of claim 9, rack mountable in a rack.

21. A method of controlling cooling of a system unit, the method comprising:

a fan control module a temperature signal from a temperature sensor;

the fan control module determining power outputs to the fans for controlling the speed thereof dependent upon the temperature signal from the temperature sensor in accordance with preprogrammed control information; and wherein speed signals from each of the fans are driven via the fan control module to a power distribution board and an alarms card.

22. The method of claim 21, further comprising the fan control module receiving power from a power supply, and the fan control module providing electrical noise isolation to isolate system components from electrical noise generated by the fans.

23. The fan control module of claim 21, wherein the fan control module individually controls the speed of two pairs of fans with a respective control loop being provided for each pair of fans.

24. The method of claim 21, wherein the fan control module individually controls the speed of a first fan for drawing air into the system unit and a second fan for driving air over a processor module in the system unit.

25. The method of claim 23, wherein a first fan of each pair of fans is a system fan for drawing air into the system unit and a second fan of each pair of fans is a processor fan for driving air over a processor module in the system unit.

* * * * *